United States Patent
Abys et al.

(10) Patent No.: US 8,323,741 B2
(45) Date of Patent: Dec. 4, 2012

(54) SELF ASSEMBLED MOLECULES ON IMMERSION SILVER COATINGS

(76) Inventors: Joseph A. Abys, Guilford, CT (US); Shenliang Sun, Bethany, CT (US); Theodore Antonellis, Bethany, CT (US)

( * ) Notice: Subject to any disclaimer, the term of this patent is extended or adjusted under 35 U.S.C. 154(b) by 0 days.

(21) Appl. No.: 13/545,030

(22) Filed: Jul. 10, 2012

(65) Prior Publication Data
US 2012/0276409 A1    Nov. 1, 2012

Related U.S. Application Data

(63) Continuation of application No. 12/268,144, filed on Nov. 10, 2008, now Pat. No. 8,216,645.

(60) Provisional application No. 60/986,481, filed on Nov. 8, 2007.

(51) Int. Cl.
*B05D 3/10* (2006.01)

(52) U.S. Cl. ........ 427/337; 427/404; 427/405; 427/435; 427/436

(58) Field of Classification Search .................. 427/337, 427/404, 405, 435, 436
See application file for complete search history.

(56) References Cited

U.S. PATENT DOCUMENTS

| | | |
|---|---|---|
| 2,080,299 A | 5/1937 | Benning et al. |
| 3,200,004 A | 8/1965 | Herbst et al. |
| 3,272,662 A | 9/1966 | Herbst et al. |
| 3,365,312 A | 1/1968 | Nowack |
| 3,398,003 A | 8/1968 | Smith et al. |
| 3,630,790 A | 12/1971 | Schmidt et al. |
| 3,837,964 A | 9/1974 | Cotton et al. |
| 3,986,967 A | 10/1976 | Okorodudu |
| 4,000,012 A | 12/1976 | Burrows et al. |
| 4,006,026 A | 2/1977 | Dahms |
| 4,052,160 A | 10/1977 | Cook et al. |
| 4,165,334 A | 8/1979 | Gosselink et al. |
| 4,178,253 A | 12/1979 | Lee et al. |
| 4,181,619 A | 1/1980 | Schmitt et al. |
| 4,209,487 A | 6/1980 | Hogue et al. |
| 4,252,662 A | 2/1981 | Marolewski et al. |
| 4,255,148 A | 3/1981 | Reinwald et al. |
| 4,303,568 A | 12/1981 | May et al. |
| 4,329,381 A | 5/1982 | Eschwey et al. |
| 4,350,600 A | 9/1982 | Sharp et al. |
| 4,351,945 A | 9/1982 | Brois et al. |

(Continued)

FOREIGN PATENT DOCUMENTS
EP    0492487    7/1992
(Continued)

OTHER PUBLICATIONS

Assouli, B. et al., "Effect of 2-mercaptobenzimidazole and its Polymeric Film on the Corrosion Inhibition of Brass 60/40) in Ammonia Solution", Corrosion Science, 2004, vol. 60, No. 4, pp. 399-407.

(Continued)

*Primary Examiner* — Eisa Elhilo
(74) *Attorney, Agent, or Firm* — Senniger Powers LLP (57) ABSTRACT

A composition for enhancing the corrosion resistance of an article comprising a silver coating deposited on a solderable copper substrate. The composition comprises: a) a multifunctional molecule comprising at least one organic functional group that interacts with and protects copper surfaces and at least one organic functional group that interacts with and protects silver surfaces; b) an alcohol; and c) a surfactant.

21 Claims, 4 Drawing Sheets

U.S. PATENT DOCUMENTS

| | | | |
|---|---|---|---|
| 4,357,396 A | 11/1982 | Grunewalder et al. | |
| 4,395,294 A | 7/1983 | Hobbins et al. | |
| 4,649,025 A | 3/1987 | Hwa et al. | |
| 4,734,257 A | 3/1988 | Penninger | |
| 4,744,950 A | 5/1988 | Hollander | |
| 4,865,927 A | 9/1989 | Laig-Horstebrock et al. | |
| 4,873,139 A | 10/1989 | Kinosky | |
| 4,908,241 A | 3/1990 | Quast et al. | |
| 5,064,723 A | 11/1991 | Lawson | |
| 5,091,113 A | 2/1992 | Clubley | |
| 5,103,550 A | 4/1992 | Wefers et al. | |
| 5,141,675 A | 8/1992 | Vanderpool et al. | |
| 5,178,916 A | 1/1993 | Chidsey et al. | |
| 5,226,956 A | 7/1993 | Askew et al. | |
| 5,300,247 A | 4/1994 | Emerich et al. | |
| 5,302,304 A | 4/1994 | Valcho | |
| 5,364,460 A | 11/1994 | Morimoto et al. | |
| 5,368,758 A | 11/1994 | Gapinski | |
| 5,463,804 A | 11/1995 | McCleary et al. | |
| 5,487,792 A | 1/1996 | King et al. | |
| 5,555,756 A | 9/1996 | Fischer et al. | |
| 5,618,634 A | 4/1997 | Hosoda et al. | |
| 5,650,385 A | 7/1997 | Dunn et al. | |
| 5,795,409 A | 8/1998 | Hirao et al. | |
| 5,853,797 A | 12/1998 | Fuchs et al. | |
| 6,102,521 A | 8/2000 | Halko et al. | |
| 6,117,795 A | 9/2000 | Pasch | |
| 6,139,610 A | 10/2000 | Sinko | |
| 6,183,815 B1 | 2/2001 | Enick et al. | |
| 6,248,701 B1 | 6/2001 | Church | |
| 6,375,822 B1 | 4/2002 | Taytsas | |
| 6,383,414 B1 | 5/2002 | Pasch | |
| 6,395,329 B2 | 5/2002 | Soutar et al. | |
| 6,461,682 B1 | 10/2002 | Crotty et al. | |
| 6,586,167 B2 | 7/2003 | Katoh et al. | |
| 6,599,445 B2 | 7/2003 | Meyer | |
| 6,627,329 B1 | 9/2003 | Shintani | |
| 6,646,082 B2 | 11/2003 | Ghosh et al. | |
| 6,731,965 B2 | 5/2004 | Menon et al. | |
| 6,773,757 B1 | 8/2004 | Redline et al. | |
| 6,803,349 B2 | 10/2004 | Negoro et al. | |
| 6,863,718 B2 | 3/2005 | Lamborn et al. | |
| 6,869,637 B2 | 3/2005 | Hutchinson et al. | |
| 6,905,587 B2 | 6/2005 | Redline et al. | |
| 6,911,490 B2 | 6/2005 | Feola et al. | |
| 6,923,692 B2 | 8/2005 | Niebauer | |
| 6,933,046 B1 | 8/2005 | Cook | |
| 7,153,445 B2 | 12/2006 | Bernards et al. | |
| 7,267,259 B2 * | 9/2007 | Redline et al. | 228/209 |
| 7,351,353 B1 | 4/2008 | Bernards et al. | |
| 7,399,801 B2 | 7/2008 | Tsuji et al. | |
| 7,524,535 B2 | 4/2009 | Kim et al. | |
| 2002/0011280 A1 | 1/2002 | Nitowski et al. | |
| 2002/0039708 A1 | 4/2002 | Katoh et al. | |
| 2004/0048486 A1 | 3/2004 | Bernards et al. | |
| 2005/0181225 A1 | 8/2005 | Destarac et al. | |
| 2005/0183793 A1 | 8/2005 | Kim et al. | |
| 2005/0217757 A1 | 10/2005 | Miyano | |
| 2005/0239295 A1 | 10/2005 | Wang et al. | |
| 2005/0263025 A1 | 12/2005 | Blees | |
| 2006/0024430 A1 | 2/2006 | Yau et al. | |
| 2007/0001150 A1 | 1/2007 | Hudgens et al. | |
| 2007/0075120 A1 | 4/2007 | Yang et al. | |
| 2007/0256590 A1 | 11/2007 | Scott et al. | |
| 2008/0108539 A1 | 5/2008 | Kany et al. | |
| 2008/0261025 A1 | 10/2008 | Abys et al. | |
| 2009/0121192 A1 | 5/2009 | Abys et al. | |
| 2010/0151263 A1 | 6/2010 | Abys et al. | |
| 2010/0319572 A1 | 12/2010 | Abys et al. | |

FOREIGN PATENT DOCUMENTS

| | | |
|---|---|---|
| EP | 0520649 | 12/1992 |
| GB | 1209778 | 10/1970 |
| GB | 2331942 | 6/1999 |
| JP | 57198269 | 12/1982 |
| JP | 2004042050 | 2/2004 |
| WO | 9619097 | 6/1996 |
| WO | 97/18905 | 5/1997 |
| WO | 03029227 | 4/2003 |
| WO | 2007/120259 | 10/2007 |
| WO | 2008/131206 | 10/2008 |

OTHER PUBLICATIONS

Cullen, Donald, "Surface Tarnish and Creeping Corrosion on Pb-Free Circuit Board Finishes", 8 pages, <http://members.ipc.org/IPCLogin/IPCMembers/IPC/Review/0106/0106TechArt.pdf>.

Makhlouf et al, "The Synergistic Effect of Halide Ions and Some Selected Thiols as a Combined Corrosion Inhibitor for Pickling ff Mild Steel in Sulphuric Acid Solution", Materials Chemistry and Physics, 1996, vol. 43, No. 1, pp. 76-82.

Mazurkiewicz, Paul, "Accelerated Corrosion of Printed Circuit Boards due to High Levels of Reduced Sulfur Gasses in Industrial Environments", Proceedings of the 23rd International Symposium for Testing and Failure Analysis, Nov. 12-16, 2006, Renaissance Austin Hotel, Austin Texas, USA, pp. 469-473.

Parikh, Atul et al., "An Intrinsic Relationship between Molecular Structure in Self-Assembled n-Alkylsiloxane Monolayers and Deposition Temperature", Journal of Physical Chemistry 1994, vol. 98, 1 page.

Perrin, F. X. et al., "Characterization and Mechanism of Direct Film Formation on a Cu electrode through electro-oxidation of 2-mercaptobenzimidazole", Corrosion Science, 1998, vol. 40, No. 10, pp. 1647-1662.

Song et al., "Synthesis and Characterization of Water-Soluble Polymeric Adhesion Promoter for Epoxy Resin/Copper Joints", Journal of Applied Polymer Science, vol. 85 Issue 10, Sep. 2002, pp. 2202-2210.

Song et al., "Adhesion Improvement of Epoxy Resin/Copper Lead Frame Joints by Azole Compounds", Journal of Adhesion Science and Technology, vol. 12, No. 5, 1998, pp. 541-561.

Tompkins et al., "The Interaction of Imidazole, Benzimidazole and Related Azoles with a Copper Surface", Surface and Interface Analysis, vol. 4, Issue 6, Dec. 1982, pp. 261-266.

Trachli, B., et al., "Protective Effect of Electropolymerized 2-Mercaptobenzimidazole upon Copper Corrosion", Progress in Organic Coating, 2002, vol. 44, pp. 17-23.

Veale, Robert, "Reliability of PCB Alternate Surface Finishes in a Harsh Industrial Environment", Proceedings of the SMTA International Conference, Sep. 25, 2005, 6 pages.

Xue, Gi, et al., "Various Adsorption States of 2-Mercaptobenzimidazole on the Surface of Gold and Silver Studied by Surface Enhanced Raman Scattering", Langmuir, 1994, vol. 10, No. 3, pp. 967-969.

Xue, Gi, et al., "Surface Reaction of 2-Mercaptobenzimidazole on Metals and its application in Adhesion Promotion", Journal of the Chemical Society Faraday Transactions, 1991, vol. 87, No. 8, pp. 1229-1232.

Abstract of JP57198269; Dec. 4, 1982.

International Preliminary Report on Patentability, PCT/US2008/082959, dated May 20, 2010, 6 pages.

International Search Report, PCT/US08/82959, dated Jan. 27, 2009, 3 pages.

Written Opinion, PCT/US08/82959, dated Jan. 27, 2009, 6 pages.

STIC Search Report dated Feb. 22, 2012.

* cited by examiner

AlphaSTAR® immersion silver
Comparison of 2x, 3x, 4x reflow
with and without post treatment
Corrosion Test: 120 min SO$_2$ and 15 min. H$_2$S

|  |  |
|---|---|
| Treatment 2, 2x reflow | No treatment, 2x reflow |
|  |  |
| Treatment 2, 3x reflow | No treatment, 3x reflow |
|  |  |
| Treatment 2, 4x reflow | No treatment, 4x reflow |

FIG. 4

SELF ASSEMBLED MOLECULES ON IMMERSION SILVER COATINGS

REFERENCE TO RELATED APPLICATION

This application is a continuation of U.S. patent application Ser. No. 12/268,144 filed Nov. 10, 2008 and issued Jul. 10, 2012 as U.S. Pat. No. 8,216,645, and claims priority from U.S. provisional application 60/986,481 filed Nov. 8, 2007.

FIELD OF THE INVENTION

The present invention generally relates to methods and compositions for depositing protective organic films on immersion silver coatings and electrolytic plated silver, particularly immersion silver coatings on copper substrates.

BACKGROUND OF THE INVENTION

For many years, bare boards comprising copper circuitry were finished with eutectic tin-lead solder coating according to the Hot Air Solder Leveling (HASL) process. Due to the Restriction of Hazardous Substances (RoHS) directive, the industry has moved away from using lead as a component of the final finish of bare boards.

Alternative final finishes include organic solderability preservative (OSP), electroless nickel-immersion gold (ENIG), immersion tin, and immersion silver. OSP is an organic coating that is susceptible to chemical and mechanical removal and thus may not adequately protect copper circuitry from oxidation. ENIG is vulnerable to common pollutants and is sensitive to high humidity and tends to fail due to corrosion. Moreover, the process is slow and difficult to control. Finally, the use of gold renders it a relatively expensive process. Immersion tin is susceptible to the formation of copper-tin intermetallic and tin oxide.

A particular problem observed with immersion silver protective coatings is creep corrosion of copper salts at certain bare copper interfaces between copper and silver. Immersion silver may not adequately cover copper surfaces for a variety of reasons. For example, immersion silver processes may not sufficiently coat copper wiring in PCB, particularly at plated through holes and high aspect ratio blind vias. Corrosion at these locations manifests itself as an annular ring surrounding the vias and plated through holes. Some exposed bare copper is present at the edge of soldermask. Additionally, immersion silver is beset by intrinsic pore formation. In other words, immersion silver processes, being self-limiting, deposit relatively thin layers. These thin layers are porous. Finally, silver is susceptible to sulfidation by reduced sulfur compounds (e.g., hydrogen sulfide) present in the environment, particularly at paper processing plants, rubber processing plants, and high pollution environments. Sufficient sulfidation of silver can result in localized areas of silver sulfide salts that, if they grow large enough, may separate from the silver layer, also forming pores. Exposed areas of copper, which may result from insufficient coverage from the immersion plating process, from intrinsic pores in the layer from the immersion silver process, or from later formed pores caused by sulfidation, are susceptible to creep corrosion. Humidity and environmental pollutants can oxidize and sulfidize the copper, forming copper salts that may creep through any location of insufficient copper coverage by the immersion silver layer.

Immersion silver coatings have been protected with a coating comprising a mercaptan. Mercaptans, however, may not sufficiently protect the board from creep corrosion. Moreover, mercaptan coatings may degrade during assembly processes employing lead-free solders, which typically occur at temperatures above 220° C. and may be as high as 270° C.

SUMMARY OF THE INVENTION

Briefly, therefore, the invention is directed to a composition for enhancing the corrosion resistance of an immersion-plated silver coating deposited on a solderable copper substrate, the composition comprising a multi-functional molecule, wherein the multi-functional molecules comprises at least one nitrogen-containing organic functional group that interacts with and protects copper surfaces and at least one sulfur-containing organic functional group that interacts with and protects silver surfaces; an alcohol; a surfactant; and an alkaline pH adjuster.

The invention is also directed to a method of enhancing the corrosion resistance of an article comprising a silver coating deposited on a solderable copper substrate, the method comprising exposing the copper substrate having the immersion-plated silver coating thereon to an anti-corrosion composition comprising a) a multi-functional molecule, wherein the multi-functional molecules comprises at least one organic functional group that interacts with and protects copper surfaces and at least one organic functional group that interacts with and protects silver surfaces; b) an alcohol; and c) a surfactant.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE EMBODIMENT(S) OF THE INVENTION

This application claims priority from U.S. provisional application 60/986,481 filed Nov. 8, 2008, the entire disclosure of which is incorporated by reference.

The present invention is directed to a method and composition for applying a protective organic film to a silver coating. The silver coating may be applied by an immersion silver plating method or by an electrolytic plating method. In a preferred embodiment, the silver coating is plated by an immersion silver plating method over a copper substrate. The protective organic film is particularly suited for preserving the integrity of the immersion silver finish and the underlying copper substrate, thereby resulting in, e.g., improved appearance, corrosion resistance, creep corrosion resistance, and solderability of copper or copper alloy substrates having a layer of immersion-plated silver thereon. Copper substrates suitable for protection with the organic protective film of the invention include circuit boards, chip carriers, semiconductor substrates, metal lead frames, connectors, and other solderable copper substrates. Silver immersion displacement plating is one method of preserving the solderability of these copper substrates. Silver immersion plating is a self-limiting process which yields silver layers having typical thicknesses between about 0.05 microns and about 0.8 microns, typically between about 0.15 microns and about 0.40 microns. Certain immersion processes and compositions can plate silver layers having thicknesses outside the broad range.

As stated above, immersion-plated silver may not adequately protect copper surfaces, such as at certain bare copper interfaces between copper and silver, particularly at plated through holes and high aspect ratio blind vias in PCB substrates. Moreover, immersion-plated silver coatings are characterized by intrinsic pores due to the self-limiting nature of the process. Finally, immersion-plated silver surfaces are susceptible to pore formation due to plating processes in addition to sulfidation and oxidation, particularly in high pollution environments. Accordingly, the present invention is directed to a method of applying a protective organic film to provide a layer of corrosion protection over copper surfaces, in addition to the immersion-plated silver coating. The method of applying the protective organic film involves exposing the copper substrate having a silver coating on a surface thereof to a composition for enhancing the corrosion resistance of an immersion-plated silver coating deposited on a solderable copper substrate.

The present invention is therefore further directed to such a composition. The composition comprises a molecule comprising functional groups capable of interacting with and protecting copper and silver surfaces. In one embodiment, the molecule comprises two or more functional groups with distinct functionality, i.e., a multi-functional molecule. Multi-functional molecules encompass bi-functional molecules in which the molecules comprise two organic functional groups with distinct functionality. According to the present invention, the bi-functional molecule comprises at least one organic functional group which interacts with and protects copper surfaces and at least one organic functional group which interacts with and protects silver surfaces. Multi-functional molecules, in the context of the present invention, further encompass tri-functional molecules, tetra-functional molecules, and so on, each molecule having three, four, or more organic functional groups with distinct functionality. In one embodiment, the organic protective film may be characterized as a self-assembled monolayer comprising the multi-functional molecule.

The multi-functional molecule comprises at least one organic functional group that interacts with and protects copper surfaces. In one embodiment, the organic functional group that interacts with and protects copper surfaces is an amine. An amine is a functional group comprising nitrogen, typically bonded to an organic substituent, such as a hydrocarbyl or an aryl. Hydrocarbyl encompasses alkyl, alkenyl, and alkynyl. The hydrocarbyl may be substituted or unsubstituted. Aryl encompasses aromatic groups, such as phenyl, naphthenyl, and groups having more than two fused rings. The aryl may be substituted or unsubstituted and may be homocyclic or heterocyclic.

Applicable amines include primary amines, secondary amines, tertiary amines, and aromatic heterocycles comprising nitrogen. Primary amines, secondary amines, and tertiary amines may have the general structure (I):

Structure (I)

wherein $R_1$, $R_2$, and $R_3$ are either hydrocarbyl, aryl, or hydrogen, and at least one of $R_1$, $R_2$, and $R_3$ is hydrocarbyl or aryl. In a typical structure, at least one of $R_1$, $R_2$, and $R_3$ is a carbon chain of the hydrocarbyl comprising between about two and about 24 carbon atoms, typically between about six and about 24 carbon atoms, more typically between about 10 and about 18 carbon atoms. Aryl groups typically between about six and about 24 carbon atoms, more typically between about six and about 10 carbon atoms, i.e., a phenyl group (substituted benzene), a naphthenyl groups (substituted naphthalene), a substituted anthracene, a substituted phenanthrene, a substituted tetracene, and so on. The hydrocarbyl and the aryl may be further substituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include additional amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers.

The aromatic heterocycle comprising nitrogen is preferably a 5-membered aromatic ring (an azole). The ring can be substituted at a carbon atom, a nitrogen atom, or both. Preferably, the ring is substituted at a carbon atom. The substituent may be the organic functional group capable of interacting with and protecting silver surfaces. Other applicable substituents include short carbon chain alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. The ring can be fused to aromatic or cycloalkyl groups, which may be homocyclic or heterocyclic. In one embodiment, the ring is fused to a 6-membered ring. Exemplary azoles which can be further substituted with additional functional groups are shown in Tables 1.

TABLE 1

| Azoles | |
|---|---|
| Name | Structure |
| Pyrrole (1H-azole) | |
| Imidazole (1,3-diazole) | |
| Pyrazole (1,2-diazole) | |

TABLE 1-continued

Azoles

| Name | Structure |
| --- | --- |
| 1,2,3-triazole | |
| 1,2,4-triazole | |
| Tetrazole | |
| Isoindole | |
| Indole (1H-Benzo[b]pyrrole) | |
| Benzimidazole (1,3-benzodiazole) | |
| Indazole (1,2-benzodiazole) | |
| 1H-Benzotriazole | |
| 2H-Benzotriazole | |
| Imidazo[4,5-b]pyridine | |
| Purine (7H-Imidazo(4,5-d)pyrimidine) | |
| Pyrazolo[3,4-d]pyrimidine | |
| Triazolo[4,5-d]pyrimidine | |

Preferred aromatic heterocyclic compounds comprising nitrogen include imidazole, triazole, pyrazole, benzimidazole, purine, imidazo[4,5-b]pyridine, and benzotriazole. Among these, benzimidazole is particularly preferred.

Without being bound to a particular theory, it is thought that primary amines, secondary amines, tertiary amines, and aromatic heterocycles comprising nitrogen interact with copper(I) ions on the surface of the copper conducting layer and copper(II) ions in solution. Interaction with copper(I) ions forms a film comprising insoluble copper(I)-based organometallics on the surface of the copper conducting layer, i.e., a film that has become known as an organometallic conversion coating (OMCC). The aromatic heterocycle comprising nitrogen chelates copper(II) ions in solution. These interactions result in the formation of a protective film on the surface of the copper conductive layer which is enriched in copper(I) ions, thereby increasing the ratio of copper(I) ions to copper (II) ions on the surface of the copper conducting layer. It is further thought that primary amines, secondary amines, tertiary amines, and aromatic heterocycles comprising nitrogen form nitrogen-copper bonds on surfaces of the copper substrate and also may form nitrogen-silver bonds on surfaces of the silver layer. Bonding represents an additional means by which organic functional groups comprising nitrogen form an organic protective layer over the copper and silver surfaces.

The multi-functional molecule comprises at least one organic functional group that interacts with and protects silver surfaces. In one embodiment, the organic functional group that interacts with and protects silver surfaces comprises sulfur. Organic functional groups comprising sulfur include thiol, disulfide, thioether, thioaldehyde, thioketone, and aromatic heterocycles comprising sulfur. Preferred organic functional groups comprising sulfur are thiol and disulfide. A thiol is a functional group comprising a sulfur atom bonded to a hydrogen atom and an organic substituent, such as a hydrocarbyl or an aryl. A disulfide is a functional group comprising a sulfur atom bonded to another sulfur atom and an organic substituent, such as a hydrocarbyl or an aryl. The hydrocarbyl may comprise between about two and about 24 carbon atoms, typically between about six and about 24 carbon atoms, more typically between about 10 and about 18 carbon atoms. Aryl groups typically between about six and about 24 carbon atoms, more typically between about six and about 10 carbon atoms, i.e., phenyl, and naphthenyl groups. The hydrocarbyl and the aryl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers.

It has been discovered that organic functional groups comprising sulfur primarily form sulfur-silver bonds on surfaces of the silver layer. They may also form sulfur-copper bonds on surfaces of the copper substrate.

According to the present invention, the organic functional group that interacts with and protects copper surfaces and the organic functional group that interacts with and protects silver surfaces are located on the same molecule, thus making the molecule a multi-functional molecule. Stated another way, the multi-functional molecule comprises a functional group comprising nitrogen and a functional group comprising sulfur.

In one embodiment, the multi-functional molecule comprises a functional group comprising nitrogen and a thiol. The multi-functional molecule may comprise additional functionality, and typically comprises hydrocarbyl or aryl that links the organic functional groups together. For example, the multi-functional molecule may comprise a hydrocarbyl group that links the amine and the thiol through a carbon chain and have a general structure (II):

Structure (II)

wherein $R_1$ is hydrocarbyl and $R_2$ and $R_3$ are hydrocarbyl, nitrogen, or hydrogen. The carbon chain of the hydrocarbyl may comprise between about two and about 24 carbon atoms, typically between about six and about 24 carbon atoms, more typically between about 12 and about 18 carbon atoms. The carbon chain of the hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces.

In one embodiment, the multi-functional molecule defined by structure (II) comprises an amine and a thiol. The amine may be a primary amine, a secondary amine, or a tertiary amine. Exemplary multi-functional molecules comprising an amine and a thiol include cysteine, methionine, 2-Aminoethanethiol (cysteamine), 3-aminopropanethiol, 4-aminobutanethiole, 5-aminopentanethiol, 6-aminohexanethiol, 8-aminooctanethiol, 10-aminodecanethiol, and 12-aminododecanethiol. The multi-functional groups comprising relatively long chain hydrocarbons may have the amino functionality at locations other than the opposite end of the hydrocarbon chain from the thiol group. For example, applicable aminododecanethiols include those in which the amino functional group is located at any of the carbons in the hydrocarbon chain.

In one embodiment, the multi-functional molecule defined by structure (II) comprises an aromatic heterocycle comprising nitrogen and a thiol. In one embodiment, the nitrogen atom, $R_2$, and $R_3$ of structure (II) forms a 5-membered aromatic heterocyclic ring. The other two atoms in the 5-membered ring may be carbon atoms or nitrogen atoms. The 5-membered aromatic heterocyclic ring may be unfused (i.e., a pyrrole, an imidazole, a pyrazole, a triazole, or a tetrazole) or may be fused to a six-member ring (i.e., an isoindole, an indole, a benzimidazole, an indazole, a benzotriazole, a purine, or an imidazo[4,5-b]pyridine). See Table I above. In this embodiment, the multi-functional molecule has the structure (IIa):

Structure (IIa)

wherein $R_1$ is hydrocarbyl and $R_2$, $R_3$, $R_4$, $R_5$ are nitrogen, sulfur, or carbon. The carbon chain of the hydrocarbyl may comprise between about two and about 24 carbon atoms, typically between about six and about 24 carbon atoms, more typically between about 12 and about 18 carbon atoms. Any of the carbon chain of the hydrocarbyl, $R_2$, $R_3$, $R_4$, and $R_5$ may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces.

In one embodiment, the nitrogen atom, a carbon atom from $R_1$, $R_2$, and $R_3$ of structure (II) forms a 5-membered aromatic heterocyclic ring. The other atom in the 5-membered ring may be carbon atom or nitrogen atom. The 5-membered aromatic heterocyclic ring may be unfused (i.e., a pyrrole, an imidazole, a pyrazole, a triazole, or a tetrazole) or may be fused to a six-member ring (i.e., an isoindole, an indole, a benzimidazole, an indazole, a benzotriazole, a purine, or an imidazo[4,5-b]pyridine).

See Table I above. In this embodiment, the multi-functional molecule may have any of the general structures (IIb) through (IIe):

Structure (IIb)

Structure (IIc)

Structure (IId)

Structure (IIe)

wherein $R_1$ is hydrocarbyl and $R_2$, $R_3$, and $R_4$ are nitrogen, sulfur, or carbon. The carbon chain of the hydrocarbyl may comprise between about two and about 24 carbon atoms, typically between about six and about 24 carbon atoms, more typically between about 12 and about 18 carbon atoms. Any of the carbon chain of the hydrocarbyl, $R_2$, $R_3$, and $R_4$ may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces.

Exemplary multi-functional molecules comprising an aromatic heterocycle comprising nitrogen and a thiol for use in the anti-corrosion composition and for use in a protective film over immersion silver and copper surfaces include:
2-mercaptobenzimidazole;
2-mercapto-5-methylbenzimidazole;
2-mercapto-5-nitrobenzimidazole;
5-Amino-2-mercaptobenzimidazole;
5-Ethoxy-2-mercaptobenzimidazole;
5-(difluoromethoxy)-2-mercapto-1H-benzimidazole;
2-mercapto-1-methylimidazole;
1-Methyl-1H-benzimidazole-2-thiol;
1-[2-(Dimethylamino)ethyl]-1H-tetrazole-5-thiol, 1-(4-Hydroxyphenyl)-1H-tetrazole-5-thiol;
1-(2-methoxyphenyl)-4-(4-nitrophenyl)-1H-imidazole-2-thiol;
1-(2-methylphenyl)-4-(4-methylphenyl)-1H-imidazole-2-thiol;
4-Phenylthiazole-2-thiol;
1H-1,2,4-Triazole-3-thiol;
2-Thiazoline-2-thiol;
4-Amino-6-mercaptopyrazolo[3,4-d]pyrimidine;
3-Amino-1,2,4-triazole-5-thiol;
4-Amino-5-(4-pyridyl)-4H-1,2,4-triazole-3-thiol;
4-Amino-5-phenyl-4H-1,2,4-triazole-3-thiol;
5-amino-1,3,4-thiadiazole-2-thiol;
2-mercapto-5-methylamino-1,3,4-thiadiazole;
5-mercapto-1-methyltetrazole;
1-phenyl-1H-tetrazole-5-thiol; and
other bath-compatible molecules having an azole and thiol functional groups.

In one embodiment, the multi-functional molecule comprises a functional group comprising nitrogen and a disulfide. This multi-functional molecule is substantially similar to the molecule comprising a functional group comprising nitrogen and the thiol, except that two thiols are bonded together through a disulfide linkage, —S—S—. Accordingly, the multi-functional molecule may have the following general structure (III):

Structure (III)

wherein $R_1$ and $R_4$ are hydrocarbyl and $R_2$, $R_3$, $R_5$, and $R_6$ are hydrocarbyl, nitrogen, or hydrogen. The carbon chain of the hydrocarbyl may comprise between about two and about 24 carbon atoms, typically between about six and about 24 carbon atoms, more typically between about 12 and about 18 carbon atoms. The carbon chain of the hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces. Exemplary molecules comprising a functional group comprising nitrogen and a disulfide include 2,2'-Dipyridyl disulfide, 4,4'-Dipyridyl disulfide 2-aminophenyl disulfide, 4-aminophenyl disulfide, cystamine (commonly available as the dihydrochloride salt), bis(2-aminoethyl)disulfide, bis(3-aminopropyl)disulfide, bis(4-aminobutyl)disulfide, bis(5-aminopentyl)disulfide, bis(6-aminohexyl)disulfide, bis(7-aminoheptyl)disulfide, bis(8-aminooctyl)disulfide, bis(10-aminodecyl)disulfide, and disulfides with longer carbon chains.

The multi-functional molecule may be present in the anti-corrosion composition at a typical concentration of about 3 g/L. The concentration is typically at this minimum concentration to achieve adequate coverage of the substrate for corrosion protection. Typically, the concentration of the multi-functional molecule is at least about 0.01 g/L, more typically at least about 0.1 g/L, even more typically at least about 1 g/L. The multi-functional molecule may be present in the anti-corrosion composition at a concentration up to its solubility limit, typically at most about 100 g/L. Typically, the concentration of the multi-functional molecule is less than about 10 g/L, more typically less than about 6 g/L. Accordingly, the concentration of the multi-functional molecule may be between about 0.1 g/L and about 10 g/L, typically between about 1 g/L and about 6 g/L, such as in one embodiment about 3 g/L.

The anti-corrosion composition is preferably an aqueous solution comprising a multi-functional molecule as described above. The anti-corrosion composition of the present invention may further comprise an alcohol, a surfactant, and an alkaline pH adjuster.

Incorporating an alcohol in the anti-corrosion composition enhances the solubility of the multi-functional compound. Applicable alcohols include alcohols, diols, triols, and higher polyols. Suitable alcohols include ethanol, propanol, isopropanol, n-butanol, isobutanol, tert-butanol, ethylene glycol, propane-1,2-diol, butane-1,2-diol, butane-1,3-diol, butane-1,4-diol, propane-1,3-diol, hexane-1,4-diol hexane-1,5-diol, hexane-1,6-diol, etc. Then there are unsaturated diols, such as butene-diol, hexene-diol, and acetylenics such as butyne diol. A suitable triol is glycerol. Additional alcohols include triethylene glycol, diethylene glycol, diethylene glycol methyl ether, triethylene glycol monomethyl ether, triethylene glycol dimethyl ether, propylene glycol, dipropylene glycol, allyl alcohol, furfuryl alcohol, and tetrahydrofurfuryl alcohol.

The alcohol may be present in the anti-corrosion composition at a concentration of at least about 10 mL/L. Typically, the concentration of the alcohol is at least about 100 mL/L, more typically at least about 150 mL/L. The alcohol may be present in the anti-corrosion composition at a concentration up to its solubility limit in water. It is within the scope of the invention to employ solvent systems comprised entirely of alcohol. In aqueous solvent systems wherein the alcohol is a supplementary solvent, the concentration of the alcohol is typically less than about 500 mL/L, more typically less than about 200 mL/L. Accordingly, the alcohol concentration may be between about 10 mL/L and about 500 mL/L, typically between about 150 mL/L and about 200 mL/L.

A surfactant may be added to enhance the wettability of the copper and silver surfaces. The surfactant may be cationic, anionic, non-ionic, or zwitterionic. A particular surfactant may be used alone or in combination with other surfactants. One class of surfactants comprises a hydrophilic head group and a hydrophobic tail. Hydrophilic head groups associated with anionic surfactants include carboxylate, sulfonate, sulfate, phosphate, and phosphonate. Hydrophilic head groups associated with cationic surfactants include quaternary amine, sulfonium, and phosphonium. Quaternary amines include quaternary ammonium, pyridinium, bipyridinium, and imidazolium. Hydrophilic head groups associated with non-ionic surfactants include alcohol and amide. Hydrophilic head groups associated with zwitterionic surfactants include betaine. The hydrophobic tail typically comprises a hydrocarbon chain. The hydrocarbon chain typically comprises between about six and about 24 carbon atoms, more typically between about eight to about 16 carbon atoms.

Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, and sulfosuccinates. Anionic surfactants include any sulfate ester, such as those sold under the trade name ULTRAFAX, including, sodium lauryl sulfate, sodium laureth sulfate (2 EO), sodium laureth, sodium laureth sulfate (3 EO), ammonium lauryl sulfate, ammonium laureth sulfate, TEA-lauryl sulfate, TEA-laureth sulfate, MEA-lauryl sulfate, MEA-laureth sulfate, potassium lauryl sulfate, potassium laureth sulfate, sodium decyl sulfate, sodium octyl/decyl sulfate, sodium 2-ethylhexyl sulfate, sodium octyl sulfate, sodium nonoxynol-4 sulfate, sodium nonoxynol-6 sulfate, sodium cumene sulfate, and ammonium nonoxynol-6 sulfate; sulfonate esters such as sodium α-olefin sulfonate, ammonium xylene sulfonate, sodium xylene sulfonate, sodium toluene sulfonate, dodecyl benzene sulfonate, and lignosulfonates; sulfosuccinate surfactants such as disodium lauryl sulfosuccinate, disodium laureth sulfosuccinate; and others including sodium cocoyl isethionate, lauryl phosphate, any of the ULTRAPHOS series of phosphate esters, Cyastat® 609 (N,N-Bis(2-hydroxyethyl)-N-(3'-Dodecyloxy-2'-Hydroxypropyl) MethylAmmonium Methosulfate) and Cyastat® LS ((3-Lauramidopropyl) trimethylammonium methylsulfate), available from Cytec Industries.

Exemplary cationic surfactants include quaternary ammonium salts such as dodecyl trimethyl ammonium chloride, cetyl trimethyl ammonium salts of bromide and chloride, hexadecyl trimethyl ammonium salts of bromide and chloride, alkyl dimethyl benzyl ammonium salts of chloride and bromide, and the like. In this regard, surfactants such as Lodyne 106A (Fluoroalkyl Ammonium Chloride Cationic Surfactant 28-30%) and Ammonyx 4002 (Octadecyl dimethyl benzyl ammonium chloride Cationic Surfactant) are particularly preferred.

In a preferred embodiment, the surfactant is non-ionic. A class of non-ionic surfactants includes those comprising polyether groups, based on, for example, ethylene oxide (EO) repeat units and/or propylene oxide (PO) repeat units. These surfactants are typically non-ionic. Surfactants having a polyether chain may comprise between about 1 and about 36 EO repeat units, between about 1 and about 36 PO repeat units, or a combination of between about 1 and about 36 EO repeat units and PO repeat units. More typically, the polyether chain comprises between about 2 and about 24 EO repeat units, between about 2 and about 24 PO repeat units, or a combination of between about 2 and about 24 EO repeat units and PO repeat units. Even more typically, the polyether chain comprises between about 6 and about 15 EO repeat units, between about 6 and about 15 PO repeat units, or a combination of between about 6 and about 15 EO repeat units and PO repeat units. These surfactants may comprise blocks of EO repeat units and PO repeat units, for example, a block of EO repeat units encompassed by two blocks of PO repeat units or a block of PO repeat units encompassed by two blocks of EO repeat units. Another class of polyether surfactants comprises alternating PO and EO repeat units. Within these classes of surfactants are the polyethylene glycols, polypropylene glycols, and the polypropylene glycol/polyethylene glycols.

Yet another class of non-ionic surfactants comprises EO, PO, or EO/PO repeat units built upon an alcohol or phenol base group, such as glycerol ethers, butanol ethers, pentanol ethers, hexanol ethers, heptanol ethers, octanol ethers, nonanol ethers, decanol ethers, dodecanol ethers, tetradecanol ethers, phenol ethers, alkyl substituted phenol ethers, α-naphthol ethers, and β-naphthol ethers. With regard to the alkyl substituted phenol ethers, the phenol group is substituted with a hydrocarbon chain having between about 1 and about 10 carbon atoms, such as about 8 (octylphenol) or about 9 carbon atoms (nonylphenol). The polyether chain may comprise between about 1 and about 24 EO repeat units, between about 1 and about 24 PO repeat units, or a combination of between about 1 and about 24 EO and PO repeat units. More typically, the polyether chain comprises between about 8 and about 16 EO repeat units, between about 8 and about 16 PO repeat units, or a combination of between about 8 and about 16 EO and PO repeat units. Even more typically, the polyether chain comprises about 9, about 10, about 11, or about 12 EO repeat units; about 9, about 10, about 11, or about 12 PO repeat units; or a combination of about 9, about 10, about 11, or about 12 EO repeat units and PO repeat units.

An exemplary β-naphthol derivative non-ionic surfactant is Lugalvan BNO12 which is a β-naphtholethoxylate having 12 ethylene oxide monomer units bonded to the naphthol hydroxyl group. A similar surfactant is Polymax NPA-15, which is a polyethoxylated nonylphenol. Another surfactant is Triton®-X100 nonionic surfactant, which is an octylphenol ethoxylate, typically having around 9 or 10 EO repeat units. Additional commercially available non-ionic surfactants include the Pluronic® series of surfactants, available from BASF. Pluronic® surfactants include the P series of EO/PO block copolymers, including P65, P84, P85, P103, P104, P105, and P123, available from BASF; the F series of EO/PO block copolymers, including F108, F127, F38, F68, F77, F87, F88, F98, available from BASF; and the L series of EO/PO block copolymers, including L10, L101, L121, L31, L35, L44, L61, L62, L64, L81, and L92, available from BASF.

Additional commercially available non-ionic surfactants include water soluble, ethoxylated nonionic fluorosurfactants available from DuPont and sold under the trade name Zonyl®, including Zonyl® FSN (Telomar B Monoether with Polyethylene Glycol nonionic surfactant), Zonyl® FSN-100, Zonyl® FS-300, Zonyl® FS-500, Zonyl® FS-510, Zonyl® FS-610, Zonyl® FSP, and Zonyl® UR. Other non-ionic surfactants include the amine condensates, such as cocoamide DEA and cocoamide MEA, sold under the trade name ULTRAFAX. Other classes of nonionic surfactants include acid ethoxylated fatty acids (polyethoxy-esters) comprising a fatty acid esterified with a polyether group typically comprising between about 1 and about 36 EO repeat units. Glycerol esters comprise one, two, or three fatty acid groups on a glycerol base.

The surfactant may be present in the preferred anti-corrosion composition at a concentration of at least about 0.01 g/L. Many surfactants provide effective wetting at very low concentrations. The minimum concentration may be adjusted to achieve adequate wetting, which depends in part on the identity of the surfactant. Typically, the surfactant concentration is at least about 0.1 g/L, more typically at least about 0.5 g/L. The surfactant may be present in the anti-corrosion composition at a concentration of less than about 10.0 g/L. Typically, the surfactant concentration is less than about 5.0 g/L, more typically less than about 2.0 g/L.

The anti-corrosion composition of the present invention preferably has a pH between about 1.0 and about 12.0, typically between about 7.0 and about 11.0. The composition is preferably alkaline because in alkaline solution, the formation of the protective organic coating is more rapid than its formation in acidic solution. Alkaline adjustment may be accomplished using alkaline pH adjusting agents, such as sodium hydroxide, potassium hydroxide, hydroxides of quaternary amines, such as tetramethylammonium hydroxide, tetraethylammonium hydroxide, and the like. Typically, the concentration of the alkaline pH adjuster is sufficient to achieve the desired alkaline pH and may be between about 0.01 g/L and about 10.0 g/L, typically between about 0.01 g/L and about 2.0 g/L, more typically between about 0.1 g/L and about 0.5 g/L.

In certain particularly preferred embodiments, the composition is free of alkali metal hydroxide, or specifically free of sodium hydroxide, and only an alternative agent such as sodium tetra borate is used for pH adjustment.

In an optional embodiment, some metal ions, such as zinc and copper ion, can be incorporated into this formula to help building a thicker film, which results in better corrosion resistance, thermal resistance, and wear resistance.

Another aspect of the present invention is directed to a method of enhancing the corrosion resistance of an immersion-plated silver coating deposited on a solderable copper substrate. The method involves exposing a copper substrate having an immersion-plated silver coating thereon to an anti-corrosion composition comprising a multi-functional molecule.

The copper substrate may be prepared with an immersion-plated silver coating by methods known in the art. For example, the method of coating a copper substrate with immersion-plated silver described in U.S. Pub. No. 2006/0024430, herein incorporated by reference in its entirety, is applicable. Commercially available chemistries for immersion silver coating include AlphaSTAR®, available from Enthone Inc. (West Haven, Conn.). Prior to exposure to the anti-corrosion composition, it may be advantageous in certain embodiments to etch the immersion-plated silver coating conventional etchants. It may be advantageous in certain embodiments to rinse the immersion-plated silver coating in alkaline or acidic solutions.

In an alternative embodiment, the substrate may be plated with an electrolytic silver coating by methods known in the art. For example, the electrolytic silver coating may be plated using SILVREX® White Metal Technology, available from Enthone Inc., West Haven, Conn., using conditions suggested by the manufacturer. This process employs an alkaline cyanide silver plating bath with a silver ion concentration between about 20 g/L and about 50 g/L and a pH between about 11 and about 13. The current density may vary between about 0.5 A/dm$^2$ and about 3 A/dm$^2$ at a plating temperature between about 15° C. and about 45° C., such that the time to plate a 1 micron thick layer is between about 1 and about 3 minutes. Silver purities exceeding 99% may be achieved using the SILVREX® plating chemistry.

The anti-corrosion composition comprising a multi-functional molecule may be applied to the substrate in any manner sufficient to achieve adequate coverage of the substrate surface. By adequate, it is meant that the method of exposure ensures that areas of bare copper are covered with the anti-corrosion composition, particularly copper-silver interfaces at high aspect ratio blind vias and plated through holes and pores that may be present in the immersion silver coating. Adequate coverage ensures that the multi-functional molecule can interact with bare copper surfaces and silver surfaces in a manner sufficient to form a protective organic film over the copper and silver surfaces. Exposure may be by flooding, dip, cascade, or spraying. The duration of exposure is not narrowly critical to the efficacy of the invention and may depend in part on engineering aspects of the process. Typical exposure times may be as little as about 1 second to as long as about 20 minutes, such as between about 1 second and about 10 minutes. In practice, the exposure time may be between about 15 seconds and about 120 seconds, typically between about 15 seconds and about 60 seconds, such as between about 30 seconds and about 60 seconds. In view of these relatively short exposure times, the method of the present invention achieves rapid substrate coating. The temperature of the anti-corrosion composition may vary between room temperature up to about 75° C., typically between about 25° C. and about 55° C., such as between about 25° C. and about 45° C. Exposure of bare copper areas to the anti-corrosion coating may be enhanced with scrubbing, brushing, squeegeeing, agitation, and stirring. In particular, agitation has been shown to be an effective means on enhancing the ability of the composition to apply a protective organic coating to the substrate. After exposing the copper substrate to the anti-corrosion composition, the substrate may be rinsed, typically with deionized water for between about 10 seconds to about 2 minutes.

Figure 1:
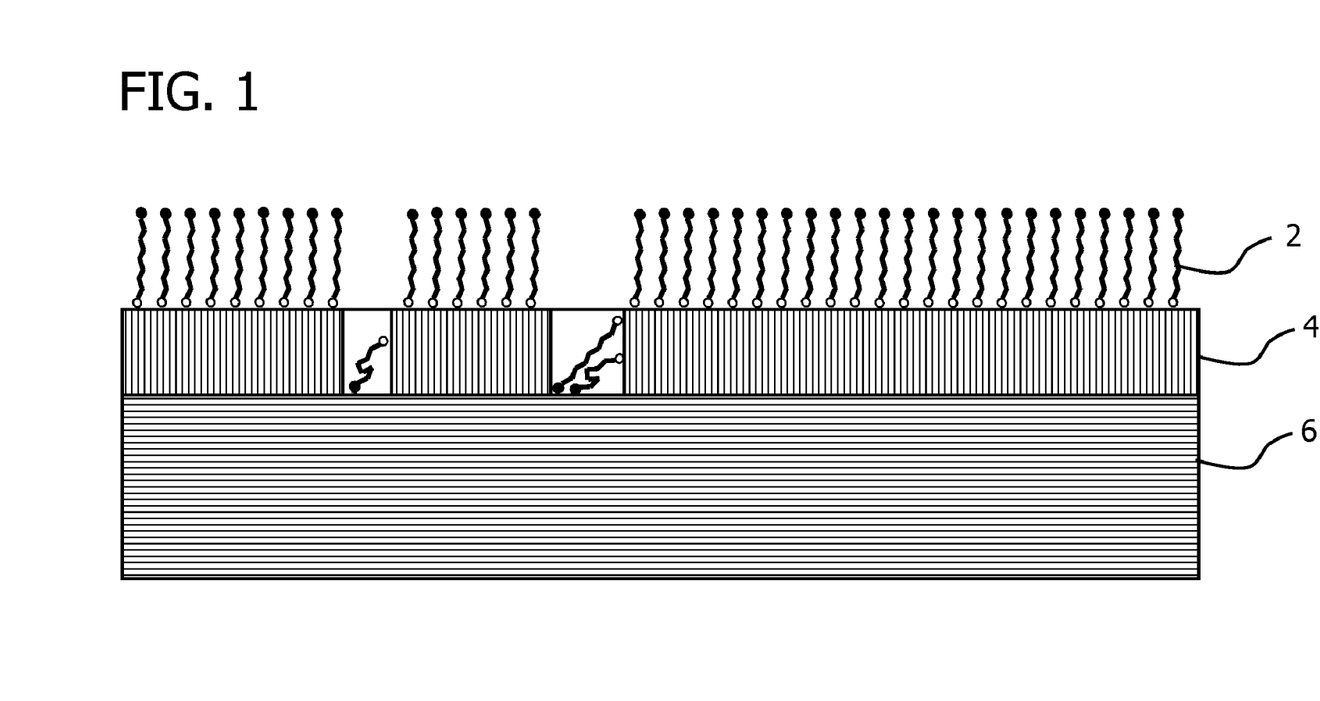
FIG. 1 is a depiction of a copper substrate having an immersion silver coating deposited thereon further covered with a protective organic film of the present invention.

Another aspect of the present invention is directed to a protective organic film applied over an immersion silver coating deposited on a solderable copper substrate. Exposure of the copper substrate having an immersion silver coating thereon to the anti-corrosion composition of the present invention results in a protective organic film on both the silver surfaces and exposed copper surfaces. The protective organic film comprises the multi-functional molecule wherein the organic functional group comprising nitrogen interacts with and protects exposed copper surfaces and the organic functional group comprising sulfur interacts with and protects silver surfaces. A depiction of this protective organic film is shown in FIG. 1, in which the functional groups of the multi-functional molecules that constitute the protective organic film 2 are shown interacting with both the copper substrate 4 and the immersion silver coating 6.

The multi-functional molecule interacts with the copper and silver surfaces in a manner similar to the conventional self-assembly of organic thiols adsorbed to gold surfaces. Accordingly, the multi-functional molecules self-assemble into a monolayer on the copper and silver surfaces. The thickness of the film may vary from approximately the length of the multi-functional molecule to several multiples (i.e., 3 or 4 times) the length of the multi-functional molecule. Typical film thicknesses may be between about 50 Angstroms and about 1 micron, more typically between about 50 Angstroms and about 1000 Angstroms. Accordingly, the protective organic film is a relatively dense, hydrophobic film that can provide enhanced protection against atmospheric moisture, which in turn, enhances the immersion silver coating's resistance to corrosion and sulfidation.

The protective organic film of the present invention may be additionally characterized by high thermal stability, particularly to temperatures commonly reached during lead-free reflow. The protective organic coatings of the present invention can better withstand reflow temperatures compared to conventional organic coatings (such as OSP) as shown by differential scanning calorimetry and thermogravimetric analysis (TGA). For example, a protective organic coating comprising 2-mercaptobenzimidazole is stable at temperatures as high as about 254° C., while only 5% of the film is lost at temperatures as high as 274° C. This compares favorably to typical reflow temperatures for eutectic tin-lead solder, which is typically reflowed at temperatures between about 230° C. and about 235° C. Moreover, the protective organic coating can withstand multiple lead-free reflow processes.

Additionally, the protective organic coating has been observed to not negatively impact visual appearance and the solderability of the copper substrate. Solderability is shown by wetting balance testing and contact resistance. Finally, the protective organic coating has been observed to increase the wear resistance and lubricity of an immersion-plated silver coating.

Having described the invention in detail, it will be apparent that modifications and variations are possible without departing from the scope of the invention defined in the appended claims.

EXAMPLES

The following non-limiting examples are provided to further illustrate the present invention.

Example 1

Anti-Corrosion Composition

An anti-corrosion composition (approximately 1 Liter) was prepared having the following components:
1. 2-mercaptobenzimidazole (0.1 grams, 98% solution, available from Sigma-Aldrich, Saint Louis, Mo.)
2. 3,3-dichlorobenzyl benzimidazole (0.1 gram)
3. n-octyl thiol (0.5 grams)
4. Tetrahydrofurfuryl alcohol (390 grams, available from Sigma-Aldrich, Saint Louis, Mo.)
5. Zinc bromide (0.1 g)
6. Pluronic P-65 (2.0 grams, available from BASF)
7. Potassium hydroxide (2.24 grams of a 50% solution)
8. Water to 1 L (approximately 600 mL).

The composition was prepared by mixing the components together and letting the composition rest for about two hours.

Example 2

Thermal Stability of 2-Mercaptobenzimidazole

The active compound, 2-mercaptobenzimidazole was subjected to thermal stability analysis by Differential Scanning calorimetry (DSC) and Thermogravimetric Analysis (TGA).

DSC showed that 2-mercaptobenzimidazole has a melting point at approximately 312° C. DSC testing showed that 2-mercaptobenzimidazole may potentially withstand lead-free reflow, which reaches temperatures as high as 270° C., typically 262° C.

The second sample was subjected to thermogravimetric analysis. Table 2 shows the decomposition progress of the 2-mercaptobenzimidazole as determined by TGA.

TABLE 2

Thermogravimetric Analysis

| Percent Decomposition | Temperature |
| --- | --- |
| 1% | 221.74° C. |
| 2% | 233.75° C. |
| 5% | 254.41° C. |
| 10% | 274.14° C. |
| 25% | 302.42° C. |
| 50% | 324.83° C. |
| 75% | 342.19° C. |

As is apparent from Table 2, 2-mercaptobenzimidazole is stable at temperatures commonly achieved for Pb-free reflow processes, with significant decomposition occurring only at temperatures exceeding 300° C.

Example 4

Corrosion Testing of Panels

Ten copper panels were coated with a layer of immersion-plated silver using AlphaSTAR®, available from Enthone Inc. The thickness of the immersion-plated silver coating was approximately six microinch. The dimensions of the testing coupons were 2 inch×3 inch.

The copper panels were tested for corrosion resistance. Two copper panels, which served as the controls, were not treated with an anti-corrosion composition while eight panels were treated an anti-corrosion composition in a manner sufficient to deposit a protective organic film.

Four panels were treated using the following anti-corrosion composition, designated Treatment #1: 2-(3,4-dichlorobenzyl)-benzimidazole (3.0 g/L), 0.1 g of zinc bromide, 0.2 g of n-octyl thiol, 0.1 g of Pluronic P-65, 2-ethoxyethanol (500 mL/L) and KOH (1.12 g/L).

Four panels were treated using the following anti-corrosion composition, designated Treatment #2: 2-mercaptobenzimidazole (0.1 grams, 98% solution, available from Sigma-Aldrich, Saint Louis, Mo.); 0.1 gram of 3,3-dichlorobenzyl benzimidazole, 0.5 grams of n-octyl thiol, tetrahydrofurfuryl alcohol (390 grams, available from Sigma-Aldrich, Saint Louis, Mo.); 0.1 g of zinc bromide, Pluronic P-65 (2.0 grams, available from BASF); potassium hydroxide (2.24 grams of a 50% solution); and water to 1 L (approximately 600 mL). The panels were treated by dipping with agitation the panels into the Treatment compositions according to the Treatment Matrix shown in Table 3. After treatment, the panels were rinsed with deionized water for 30 seconds.

One control panel was subjected to 2× reflow:

TABLE 3

Treatment Matrix

| Controls | Control, 2× reflow | Control, 0× reflow | | |
| --- | --- | --- | --- | --- |
| Sample Identification Number | 1 | 3 | 5 | 7 |

TABLE 3-continued

Treatment Matrix

| Controls | | Control, 2× reflow | Control, 0× reflow |
| --- | --- | --- | --- |
| Treatment #1 | 30 seconds at 25° C. | 30 seconds at 45° C. | 120 seconds at 25° C. | 120 seconds at 45° C. |
| Sample Identification Number | 2 | 4 | 6 | 8 |
| Treatment #2 | 30 seconds at 25° C. | 30 seconds at 45° C. | 120 seconds at 25° C. | 120 seconds at 45° C. |

The panels were then subjected to corrosion testing by exposing the panels first to an atmosphere containing sulfur dioxide and then to an atmosphere containing hydrogen sulfide. First, the panels were placed in a sealed glass dessicator (approximately 150 mm diameter) comprising a sulfurous acid solution (6% concentration, 150 mL) for 120 minutes. Next, the panels were placed in a sealed glass dessicator (approximately 150 mm diameter) comprising hydrogen sulfide (1 mL of 23.5% solution of $(NH_4)_2S$ in 100 mL water) for 15 minutes.

Figure 2:
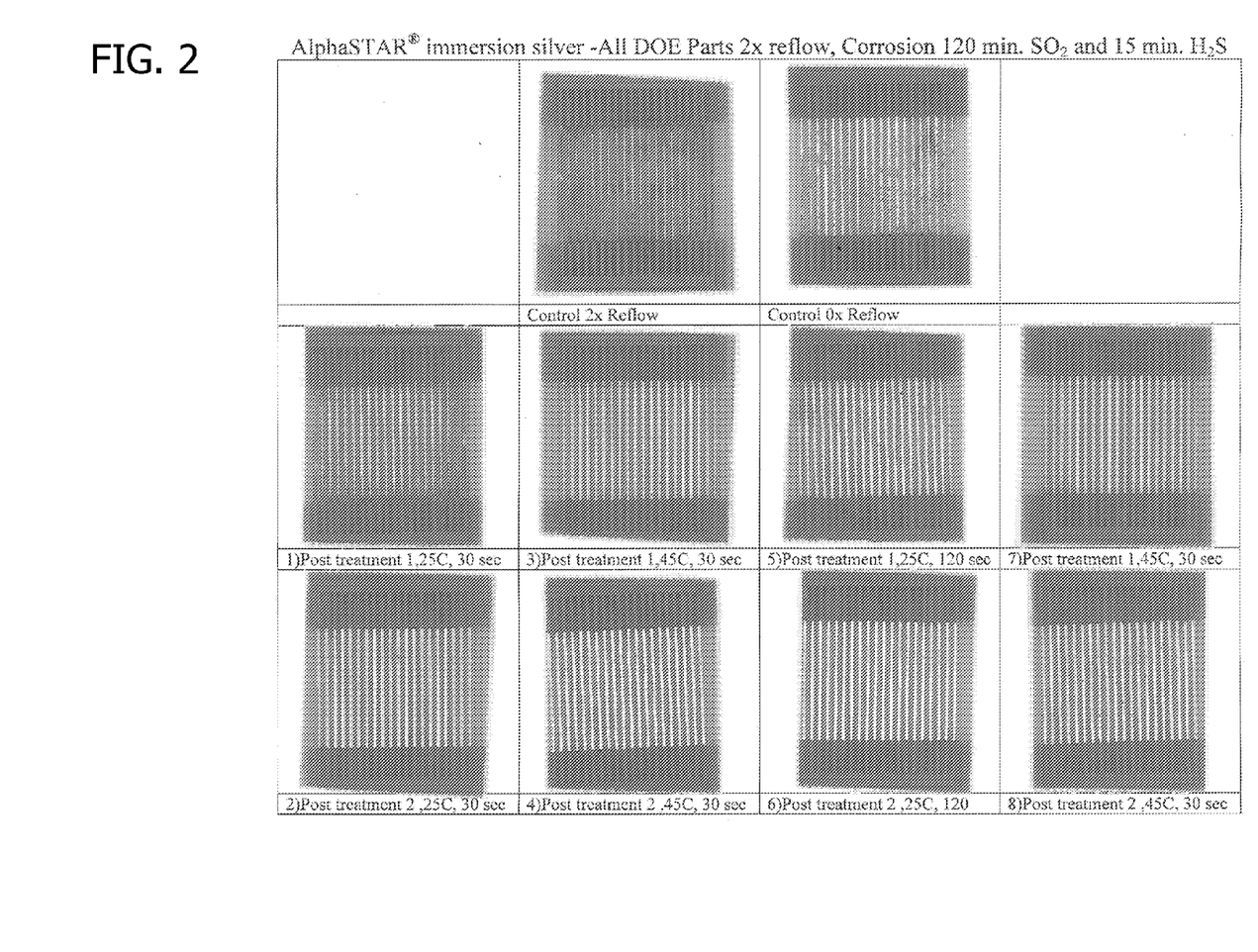
FIG. 2 is a photograph displaying panels subjected to corrosion testing according to the method of Example 4.

The panels were visually inspected for corrosion. FIG. 2 is a photograph displaying the panels according to the Treatment Matrix in Table 3. The four panels in the bottom row (pertaining to Treatment #2) exhibited the least corrosion.

Example 5

Corrosion Testing of Coupons Through Multiple Reflows

Six copper coupons, which were copper cladded FR4 laminate) were coated with a layer of immersion silver using AlphaSTAR®, available from Enthone Inc.

The copper coupons were tested for corrosion resistance through multiple reflows. Three copper coupons, which served as controls, were not treated with an anti-corrosion composition. Three copper coupons were treated with agitation using the anti-corrosion composition designated Treatment #2 from Example 4. After treatment, the coupons were rinsed with deionized water for 30 seconds.

The panels were subjected to reflow. Two panels were subjected to 2× reflow (one control and one that was coated with an organic protective film); two panels were subjected to 3× reflow (one control and one that was coated with an organic protective film); and two panels were subjected to 4× reflow (one control and one that was coated with an organic protective film). The coupons were then subjected to corrosion testing by exposing the panels first to an atmosphere containing sulfur dioxide (ASTM B799) and then to an atmosphere containing hydrogen sulfide.

First, the panels were placed in a sealed glass dessicator (approximately 150 mm diameter) comprising a sulfurous acid solution (6% concentration, 150 mL) for 120 minutes. Next, the panels were placed in a sealed glass dessicator (approximately 150 mm diameter) comprising hydrogen sulfide (1 mL of 23.5% solution of $(NH_4)_2S$ in 100 mL water) for 15 minutes.

Figure 3:
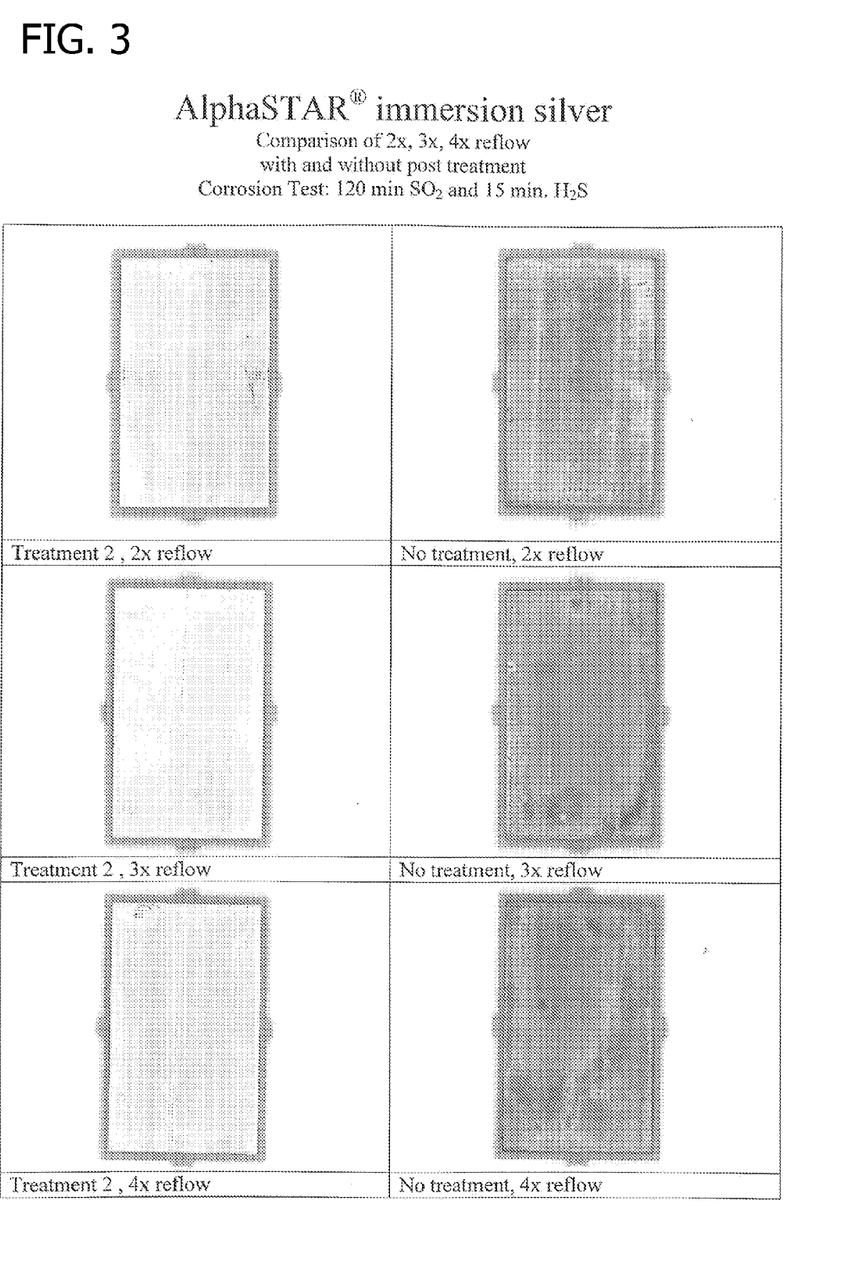
FIG. 3 is a photograph displaying coupons subjected to corrosion testing according to the method described in Example 5.

The coupons were visually inspected for corrosion. FIG. 3 is a photograph displaying the coupons, wherein the top row of coupons were subjected to 2× reflow, the middle row of coupons were subjected to 3× reflow, and the bottom row of coupons were subjected to 4× reflow. The left column of coupons contained the protective organic film while the right column of coupons was left untreated. It was apparent that the protective organic film substantially inhibited corrosion even after 4× reflow, while the control panels exhibited substantial corrosion after 2× reflow.

Example 6

Performance Testing of Protective Organic Films

Copper coupons (2 inch×3 inch copper cladded laminate) were coated with a layer of immersion silver using AlphaSTAR®, available from Enthone Inc. The copper coupons having a layer of immersion silver thereon were subjected to performance testing.

Figure 4:
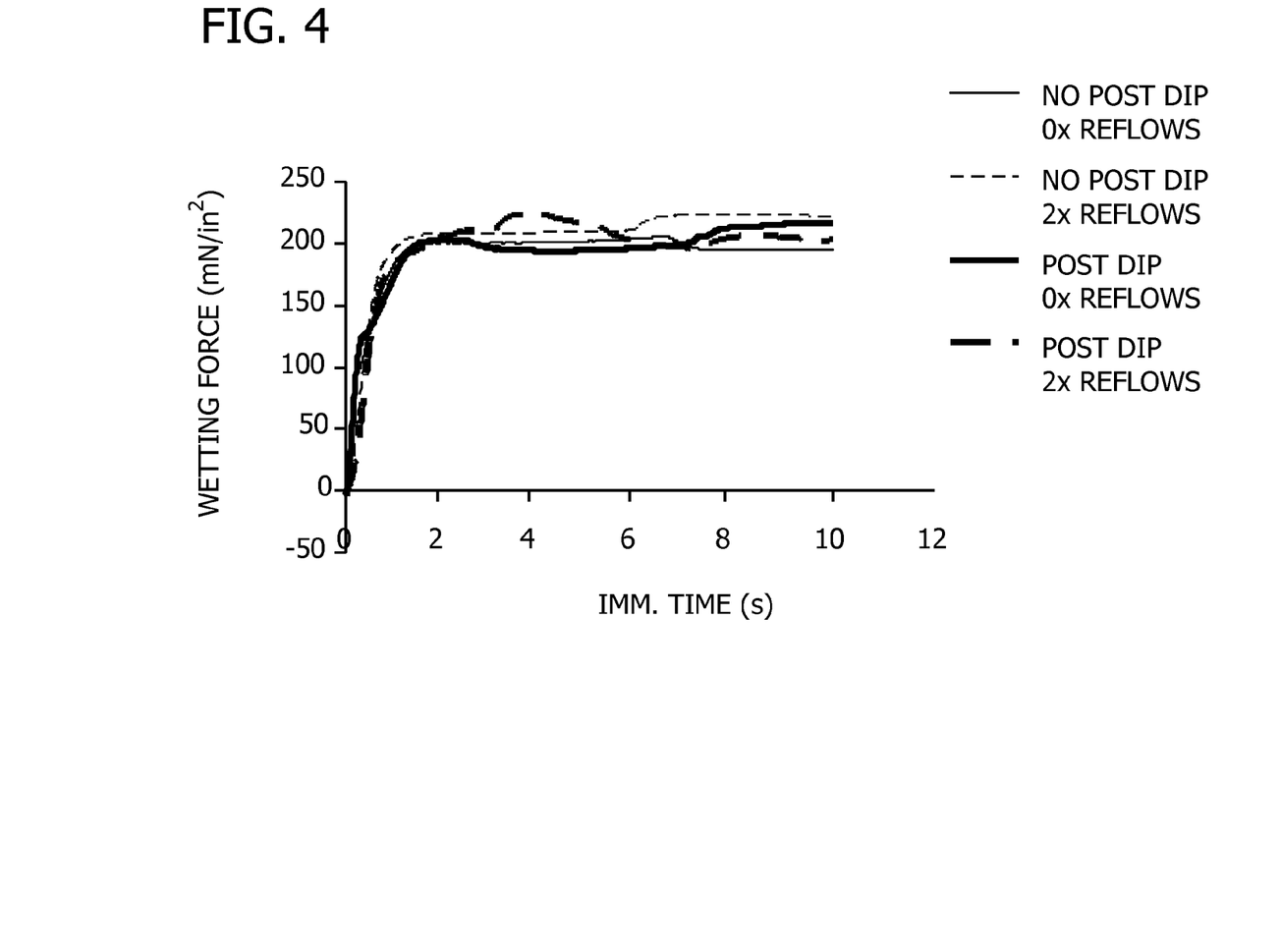
FIG. 4 is a graph showing the results of wetting balance evaluation according to the method described in Example 6.

In the first performance test, four coupons were subjected to a wetting balance test using eutectic tin-lead solder and flux, according to industrial standard testing method IPC J-STD-003A. Two copper coupons, which served as controls, were not treated with an anti-corrosion composition. Two copper coupons were treated with agitation using the anti-corrosion composition designated Treatment #2 from Example 4. After treatment, the coupons were rinsed with deionized water for 30 seconds. Two of the coupons (one treated coupon and one untreated coupons) were subjected to wetting balance evaluation prior to reflow. Two of the coupons (one treated coupon and one untreated coupons) were subjected to wetting balance evaluation after subjected them to 2× reflow according to the lead-free reflow profile presented above. The results of the wetting balance test are depicted graphically in FIG. 4.

In the second performance test, four coupons were subjected to a contact resistance test using eutectic tin-lead solder and flux according to ASTM B539. Two copper coupons, which served as controls, were not treated with an anti-corrosion composition. Two copper coupons were treated using the anti-corrosion composition designated Treatment #2 from Example 4. After treatment, the coupons were rinsed with deionized water for 30 seconds. Two of the coupons (one treated coupon and one untreated coupons) were subjected to contact resistance evaluation prior to reflow. Two of the coupons (one treated coupon and one untreated coupons) were subjected to contact resistance evaluation after subjected them to 2× reflow. The results show that the contact resistance varies slightly among all samples, but the variation is very marginal.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and methods without departing from the scope of the invention, it is intended that all matter contained in the above description and shown in the accompanying drawings shall be interpreted as illustrative and not in a limiting sense.

What is claimed is:

1. A composition for enhancing the corrosion resistance of an article comprising a silver coating deposited on a solderable copper substrate, the composition comprising:
   a multi-functional molecule, wherein the multi-functional molecules comprises at least one sulfur-containing organic functional group that interacts with and protects silver surfaces and at least one nitrogen-containing organic functional group that interacts with and protects copper surfaces, wherein the nitrogen-containing functional group comprises one of an amine or aromatic heterocycle;

an alcohol;

a surfactant; and an alkaline pH adjuster.

2. The composition of claim 1 wherein the nitrogen-containing functional group comprises the amine.

3. The composition of claim 1 wherein the nitrogen-containing functional group comprises one of a primary amine, secondary amine, tertiary amine, or aromatic heterocycle.

4. The composition of claim 1 wherein the nitrogen-containing functional group comprises an azole.

5. The composition of claim 1 wherein the nitrogen-containing functional group comprises a benzimidazole.

6. The composition of claim 1 wherein the sulfur-containing functional group comprises one of a thiol, disulfide, thioether, thioaldehyde, thioketone, or aromatic heterocycle.

7. The composition of claim 3 wherein the sulfur-containing functional group comprises one of a thiol, disulfide, thioether, thioaldehyde, thioketone, or aromatic heterocycle.

8. The composition of claim 5 wherein the sulfur-containing functional group comprises one of a thiol, disulfide, thioether, thioaldehyde, thioketone, or aromatic heterocycle.

9. The composition of claim 1 wherein the sulfur-containing functional group comprises a thiol.

10. The composition of claim 1 wherein the sulfur-containing functional group comprises a disulfide.

11. The composition of claim 1 wherein the multi-functional molecule comprises azole and thiol functional groups.

12. The composition of claim 1 wherein the multi-functional molecule has one of the following structures:

Structure (IIb)

Structure (IIc)

Structure (IId)

Structure (IIe)

wherein $R_1$ is hydrocarbyl and $R_2$, $R_3$, and $R_4$ are nitrogen, sulfur, or carbon; the carbon chain of the hydrocarbyl comprises between two and about 24 carbon atoms; and any of the carbon chain of the hydrocarbyl, $R_2$, $R_3$, and $R_4$ may be substituted or unsubstituted.

13. The composition of claim 3 wherein the multi-functional molecule has one of the following structures:

Structure (IIb)

Structure (IIc)

Structure (IId)

Structure (IIe)

wherein $R_1$ is hydrocarbyl and $R_2$, $R_3$, and $R_4$ are nitrogen, sulfur, or carbon; the carbon chain of the hydrocarbyl comprises between two and about 24 carbon atoms; and any of the carbon chain of the hydrocarbyl, $R_2$, $R_3$, and $R_4$ may be substituted or unsubstituted.

14. The composition of claim 5 wherein the multi-functional molecule has one of the following structures:

Structure (IIb)

Structure (IIc)

Structure (IId)

Structure (IIe)

wherein $R_1$ is hydrocarbyl and $R_2$, $R_3$, and $R_4$ are nitrogen, sulfur, or carbon; the carbon chain of the hydrocarbyl comprises between two and about 24 carbon atoms; and any of the carbon chain of the hydrocarbyl, $R_2$, $R_3$, and $R_4$ may be substituted or unsubstituted.

15. The composition of claim 1 wherein the alcohol is present in a concentration between about 10 mL/L and about 500 mL/L.

16. The composition of claim 1 wherein the surfactant is non-ionic.

17. The composition of claim 1 wherein the multi-functional molecule is present in a concentration between about 0.1 g/L and about 10 g/L.

18. The composition of claim 1 wherein:

the alcohol is present in a concentration between about 10 mL/L and about 500 mL/L;

the surfactant is non-ionic and present in a concentration between about 0.01 g/L and about 2 g/L; and the multi-functional molecule is present in a concentration between about 0.1 g/L and about 10 g/L.

19. The composition of claim 1 wherein:
the alcohol is present in a concentration between about 10 mL/L and about 500 mL/L;
the surfactant is non-ionic and present in a concentration between about 0.01 g/L and about 2 g/L; and
the multi-functional molecule is present in a concentration between about 0.1 g/L and about 10 g/L.

20. The composition of claim 1 wherein the composition is free of alkali metal hydroxide.

21. An article comprising a silver coating on a copper substrate, with a protective organic film over the silver coating formed by exposing the copper substrate having the silver coating thereon to the anti-corrosion composition of claim 1.

* * * * *